US008673709B2

(12) United States Patent
Lee et al.

(10) Patent No.: US 8,673,709 B2
(45) Date of Patent: Mar. 18, 2014

(54) FINFETS WITH MULTIPLE FIN HEIGHTS

(71) Applicant: Taiwan Semiconductor Manufacturing Company, Ltd., Hsin-Chu (TW)

(72) Inventors: Tsung-Lin Lee, Hsin-Chu (TW); Chih Chieh Yeh, Taipei (TW); Chang-Yun Chang, Taipei (TW); Feng Yuan, Yonghe (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/764,549

(22) Filed: Feb. 11, 2013

(65) Prior Publication Data

US 2013/0149826 A1 Jun. 13, 2013

Related U.S. Application Data

(62) Division of application No. 12/843,595, filed on Jul. 26, 2010, now Pat. No. 8,373,238.

(60) Provisional application No. 61/266,427, filed on Dec. 3, 2009.

(51) Int. Cl.
*H01L 21/8234* (2006.01)

(52) U.S. Cl.
USPC ............. 438/197; 438/150; 438/187; 257/66; 257/76; 257/49; 257/E29.104; 257/E21.53

(58) Field of Classification Search
USPC ........ 438/150, 187, 196–197; 257/66, 77, 49, 257/E29.104, E29.292
See application file for complete search history.

(56) References Cited

U.S. PATENT DOCUMENTS

| | | | |
|---|---|---|---|
| 6,706,571 B1 | 3/2004 | Yu et al. | |
| 6,858,478 B2 | 2/2005 | Chau et al. | |
| 7,190,050 B2 | 3/2007 | King et al. | |
| 7,247,887 B2 | 7/2007 | King et al. | |
| 7,265,008 B2 | 9/2007 | King et al. | |
| 7,508,031 B2 | 3/2009 | Liu et al. | |
| 7,528,465 B2 | 5/2009 | King et al. | |
| 7,605,449 B2 | 10/2009 | Liu et al. | |
| 2005/0153490 A1 | 7/2005 | Yoon et al. | |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2007/0221956 A1 | 9/2007 | Inaba | |
| 2008/0157225 A1 | 7/2008 | Datta et al. | |
| 2008/0290470 A1 | 11/2008 | King et al. | |
| 2008/0296632 A1 | 12/2008 | Moroz et al. | |
| 2009/0181477 A1 | 7/2009 | King et al. | |

*Primary Examiner* — Elias M Ullah
(74) *Attorney, Agent, or Firm* — Slater & Matskil, L.L.P.

(57) ABSTRACT

An integrated circuit structure includes a semiconductor substrate, and a FinFET over the semiconductor substrate. The FinFET includes a semiconductor fin; a gate dielectric on a top surface and sidewalls of the semiconductor fin; a gate electrode on the gate dielectric; and a source/drain region at an end of the semiconductor fin. A first pair of shallow trench isolation (STI) regions includes portions directly underlying portions of the source/drain regions, wherein the first pair of STI regions is separated by, and adjoining a semiconductor strip. The first pair of STI regions further has first top surfaces. A second pair of STI regions comprises portions directly underlying the gate electrode, wherein the second pair of STI regions is separated from each other by, and adjoining, the semiconductor strip. The second pair of STI regions has second top surfaces higher than the first top surfaces.

20 Claims, 17 Drawing Sheets

FINFETS WITH MULTIPLE FIN HEIGHTS

This application is a divisional of U.S. patent application Ser. No. 12/843,595 filed on Jul. 26, 2010, entitled "FinFETs with Multiple Fin Heights," which application further claims the benefit of U.S. Provisional Application No. 61/266,427 filed on Dec. 3, 2009, entitled "FinFETs with Multiple Fin Heights," which applications are hereby incorporated herein by reference.

TECHNICAL FIELD

This application relates generally to integrated circuits, and more particularly to semiconductor fins and Fin field-effect transistors (FinFETs) and methods for forming the same.

BACKGROUND

With the increasing down-scaling of integrated circuits and increasingly demanding requirements for higher speed of integrated circuits, transistors need to have higher drive currents with increasingly smaller dimensions. Fin field-effect transistors (FinFETs) were thus developed. FinFETs have increased channel widths because the channels include sidewall portions in addition to the portions on the top surfaces of the fins. Since the drive currents of transistors are proportional to the channel widths, the drive currents of FinFETs are increased over that of planar transistors.

SUMMARY

In accordance with one aspect of the embodiment, an integrated circuit structure includes a semiconductor substrate, and a FinFET over the semiconductor substrate. The FinFET includes a semiconductor fin; a gate dielectric on a top surface and sidewalls of the semiconductor fin; a gate electrode on the gate dielectric; and a source/drain region at an end of the semiconductor fin. A first pair of shallow trench isolation (STI) regions includes portions directly underlying portions of the source/drain regions, wherein the first pair of STI regions is separated by, and adjoining a semiconductor strip. The first pair of STI regions further has first top surfaces. A second pair of STI regions comprises portions directly underlying the gate electrode, wherein the second pair of STI regions is separated from each other by, and adjoining, the semiconductor strip. The second pair of STI regions has second top surfaces higher than the first top surfaces.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

A novel method for forming semiconductor fin(s) with different fin heights and fin field-effect transistor(s) (FinFET(s)) is provided. The intermediate stages in the manufacturing of an embodiment are illustrated. The variations of the embodiment are discussed. Throughout the various views and illustrative embodiments, like reference numbers are used to designate like elements.

Figure 1:
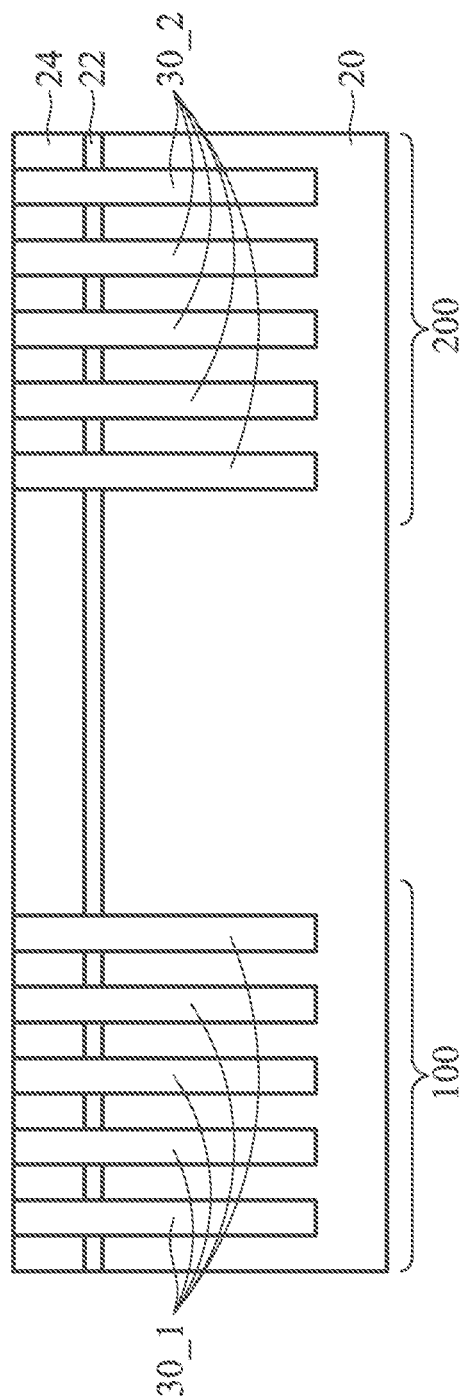
FIGS. 1 through 10 are cross-sectional views of intermediate stages in the manufacturing of semiconductor fins having different fin heights in accordance with an embodiment.

Referring to FIG. 1, semiconductor substrate 20 is provided. In an embodiment, semiconductor substrate 20 includes silicon. Other commonly used materials, such as carbon, germanium, gallium, arsenic, nitrogen, indium, and/or phosphorus, and the like, may also be included in semiconductor substrate 20.

Figure 17:
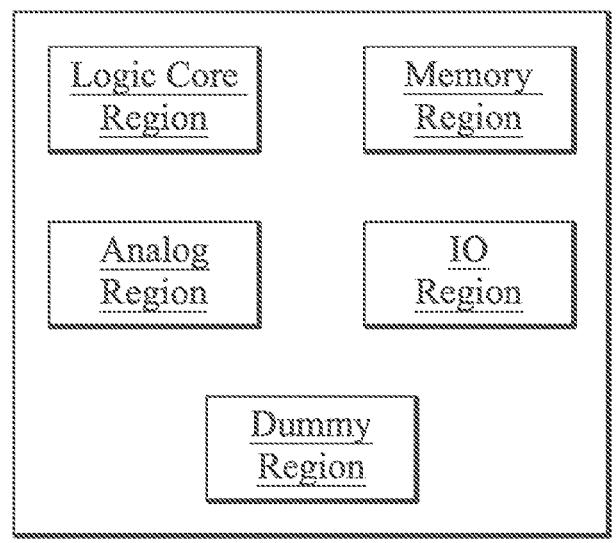
FIG. 17 illustrates device regions in a semiconductor chip.

Semiconductor substrate 20 includes a portion in device region 100 and a portion in device region 200. In an embodiment, device regions 100 and 200 are different regions selected from the group consisting essentially of a logic core region, a memory region (such as an embedded static random access memory (SRAM) region), an analog region, an input/output (IO, also referred to as a peripheral) region, a dummy region (for forming dummy patterns), and the like. The above-referenced device regions are schematically illustrated in FIG. 17. In an exemplary embodiment, device region 100 is a logic core region, while device region 200 is an IO region. In alternative embodiments, device region 100 is a p-type FinFET region, while device region 200 is an n-type FinFET region.

Pad layer 22 and mask layer 24 may be formed on semiconductor substrate 20. Pad layer 22 may be a thin film comprising silicon oxide formed, for example, using a thermal oxidation process. Pad layer 22 may act as an adhesion layer between semiconductor substrate 20 and mask layer 24. Pad layer 22 may also act as an etch stop layer for etching mask layer 24. In an embodiment, mask layer 24 is formed of silicon nitride, for example, using low-pressure chemical vapor deposition (LPCVD). In other embodiments, mask layer 24 is formed by thermal nitridation of silicon, plasma enhanced chemical vapor deposition (PECVD), or plasma anodic nitridation. Mask layer 24 is used as a hard mask during subsequent photolithography processes.

STI regions 30 (denoted as 30_1 and 30_2) are formed in semiconductor substrate 20. The depth of STI regions 30 may be between about 100 nm and about 250 nm, although different depths are also applicable. It is realized, however, that the dimensions recited throughout the description are merely examples, and may be changed if different formation technologies are used. The formation of STI regions 30 may be performed using known methods, and hence the process details are not described in detail herein.

Figure 2:
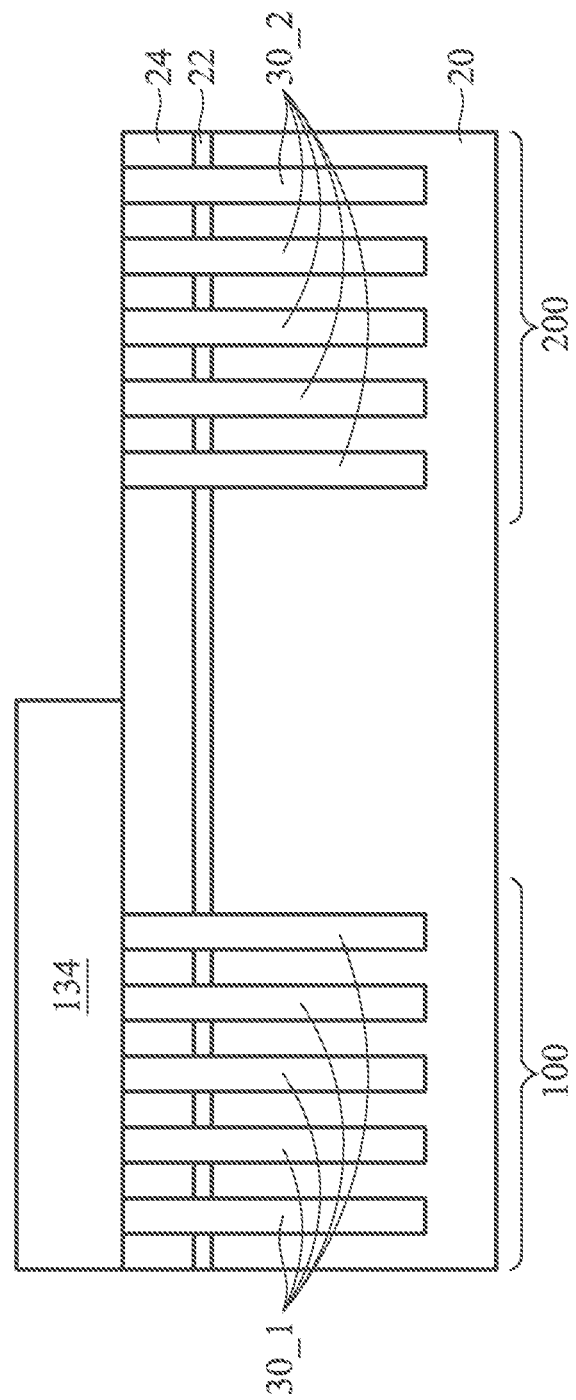
Figure 3:
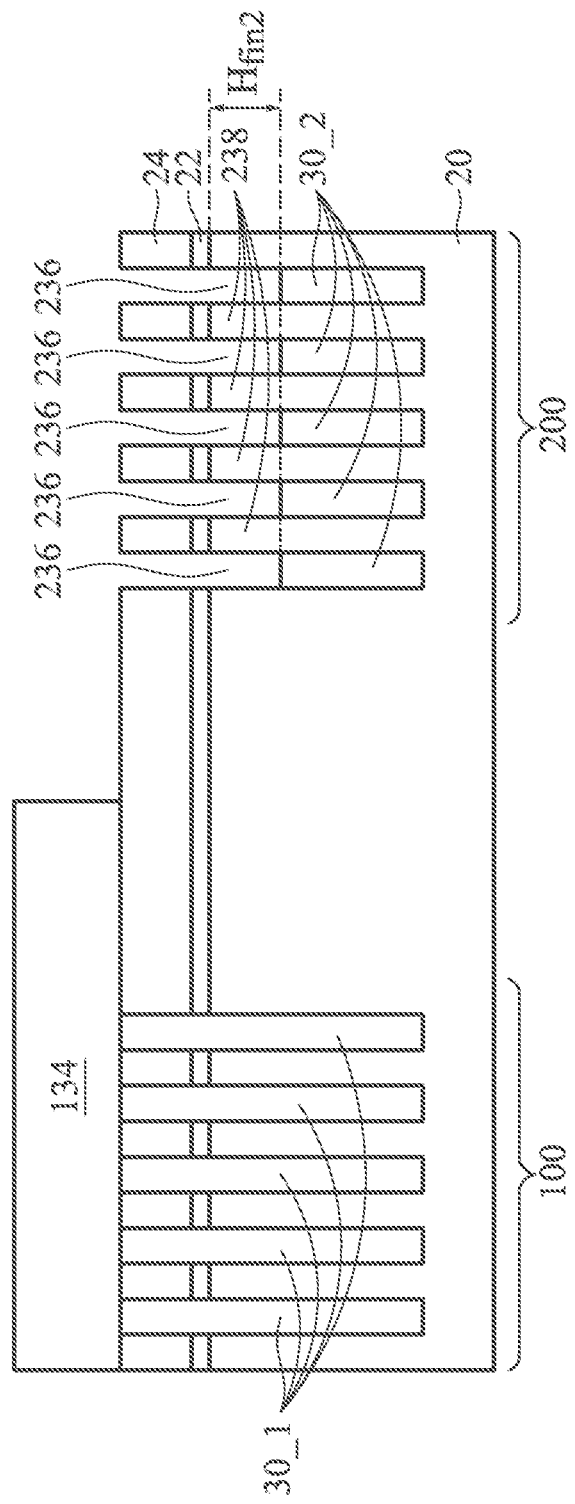

Referring to FIG. 2, device region 100 is masked by photo resist 134, leaving device region 200 exposed. The exposed STI regions 30_2 are then recessed through an etching step, resulting in recesses 236 in semiconductor substrate 20. The resulting structure is shown in FIG. 3. The portions of semiconductor substrate 20 between recesses 236 thus become fins 238, which has a fin height denoted as $H_{fin2}$. In an exemplary embodiment, fin height $H_{fin2}$ is between about 15 nm and about 30 nm, although it may also be greater or smaller. Photo resist 134 is then removed.

Figure 4:
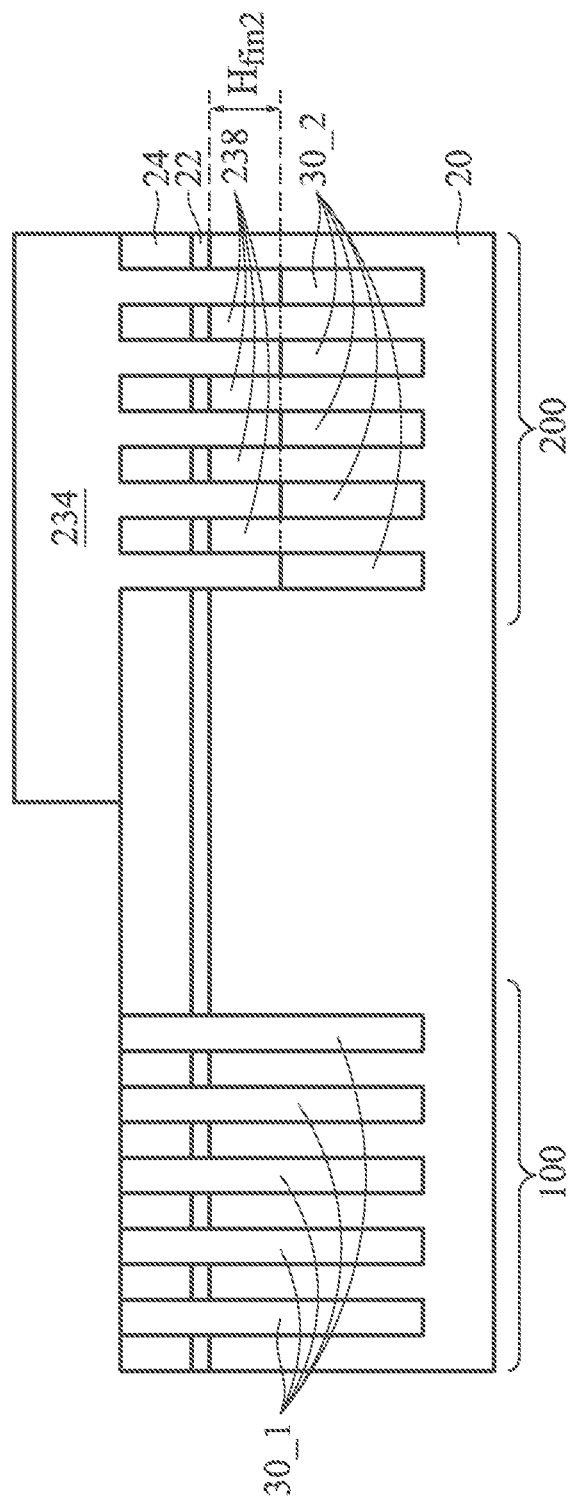
Figure 5:
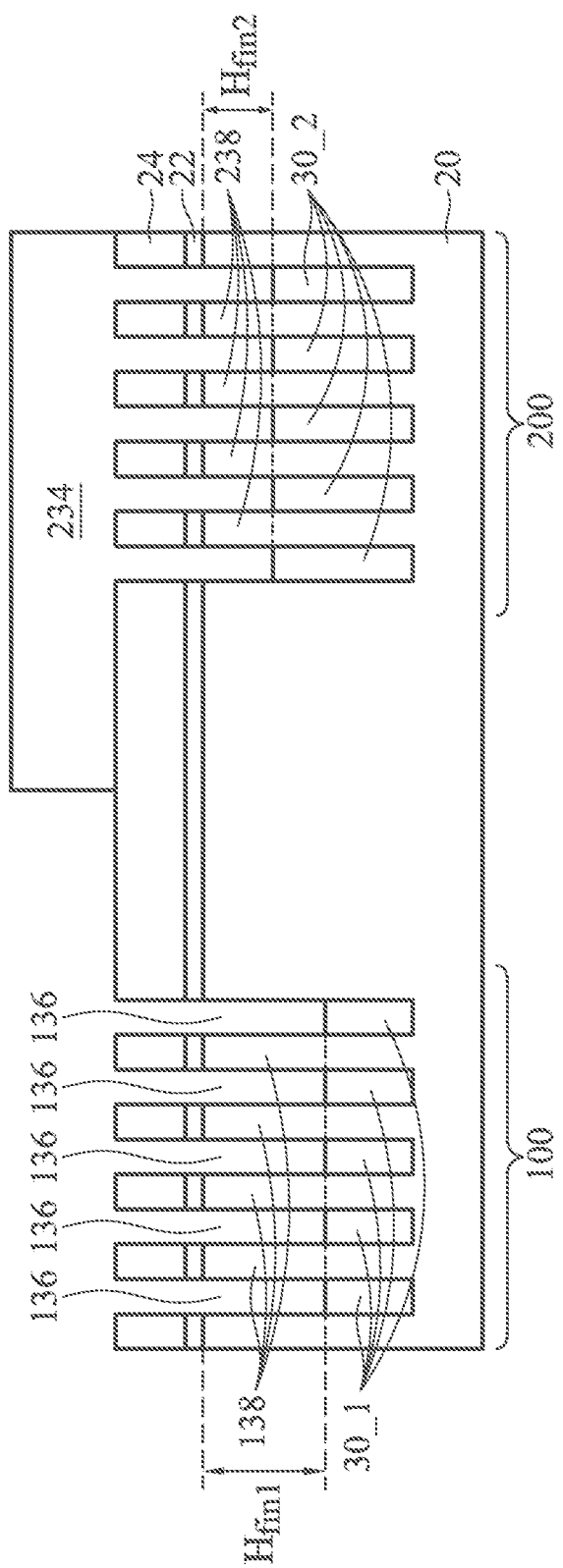

Referring to FIG. 4, device region 200 is masked by photo resist 234, leaving device region 100 exposed. The exposed STI regions 30_1 are then recessed through an etching step, resulting in recesses 136, as is shown in FIG. 5. The portions of semiconductor substrate 20 between recesses 136 thus become fins 138, which has a fin height denoted as $H_{fin1}$. In an exemplary embodiment, fin height $H_{fin1}$ is between about 25 nm and about 40 nm, although it may also be greater or smaller. Fin heights $H_{fin1}$ and $H_{fin2}$ are different from each other. The fin height difference ($H_{fin2}-H_{fin1}$) may be greater than about 5 nm, or even greater than about 10 nm. Further, a ratio of $H_{fin1}/H_{fin2}$ may be greater than about 1.25, or even greater than about 1.33.

Figure 6:
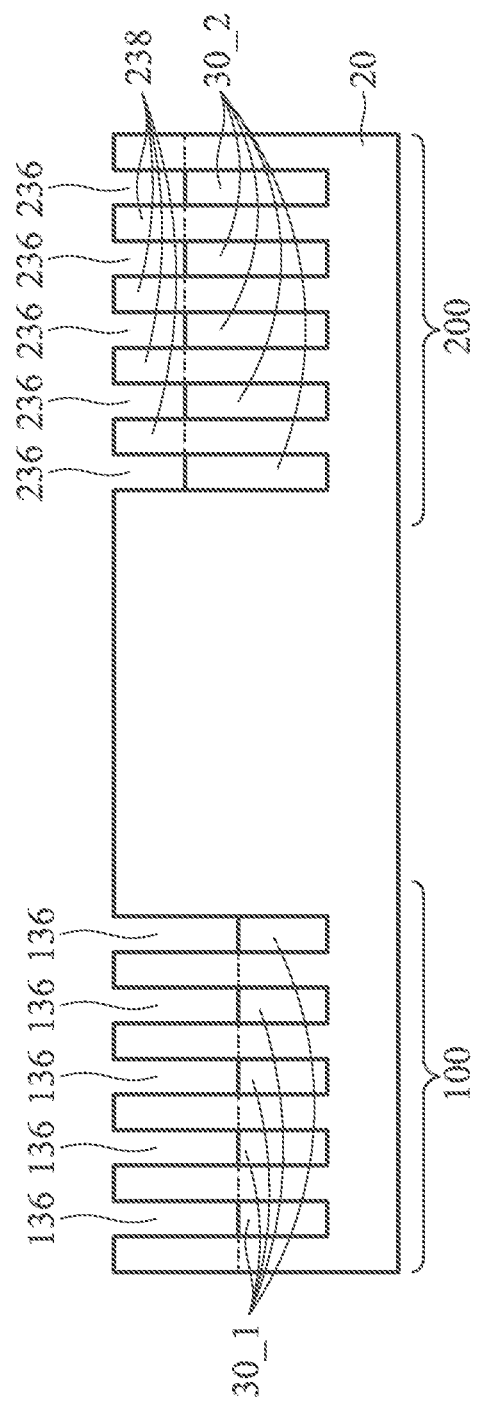

Next, as shown in FIG. 6, mask layer 24 and pad layer 22 are removed. Mask layer 24, if formed of silicon nitride, may be removed by a wet process using hot $H_3PO_4$, while pad layer 22 may be removed using diluted HF acid, if formed of silicon oxide. It is noted that in the structure shown in FIG. 6, the portion of substrate 20 below the bottoms of STI regions 30 may be treated as a semiconductor substrate, while fins 138 and 238 may be treated as being over the semiconductor substrate.

Figure 7:
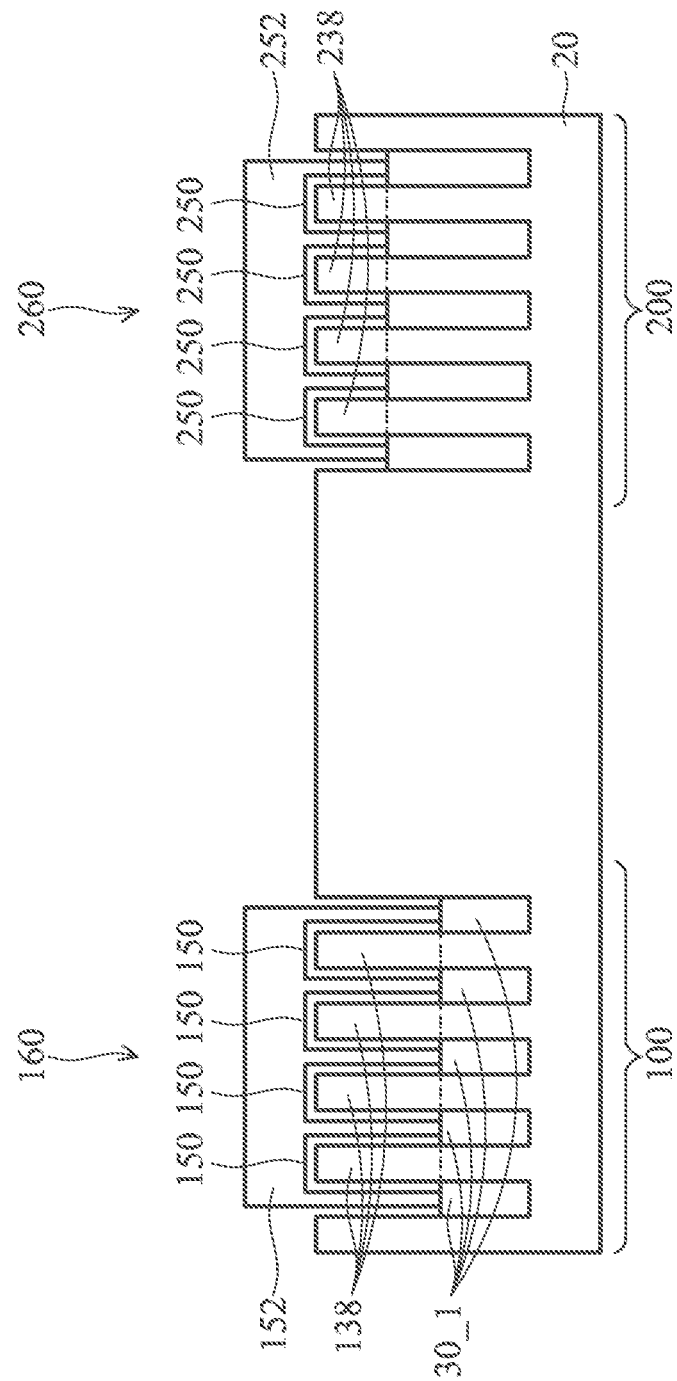

FIG. 7 illustrates the formation of FinFETs 160 and 260 in device regions 100 and 200, respectively. First, well dopants are introduced into the exposed fins 138 and 238, for example, by implantations. In the embodiment in which device region 100 is a p-type FinFET region and device region 200 is an n-type FinFET region, an n-type impurity implantation is performed to dope an n-type impurity such as phosphorous into fins 138, and a p-type impurity implantation is performed to dope a p-type impurity such as boron into fins 238. For simplicity, the masks used for doping the wells are not shown. Gate dielectrics 150 and 250 are formed to cover the top surface and sidewalls of fins 138 and 238, respectively. Gate dielectrics 150 and 250 may be formed by thermal oxidation, and hence may include thermal silicon oxide. Gate electrodes 152 and 252 are then formed on gate dielectrics 150 and 250, respectively. In an embodiment, each of gate electrodes 152 and 252 covers more than one of fins 138 and 238, so that each of the resulting FinFETs 160 and 260 comprises more than one fin 138 and 238, respectively. In alternative embodiments, each of fins 138 and/or 238 may be used to form one FinFET. The remaining components of FinFETs 160 and 260, including source and drain regions and source and drain silicides (not shown), are then formed. The formation processes of these components are known in the art, and hence are not repeated herein.

Figure 8:
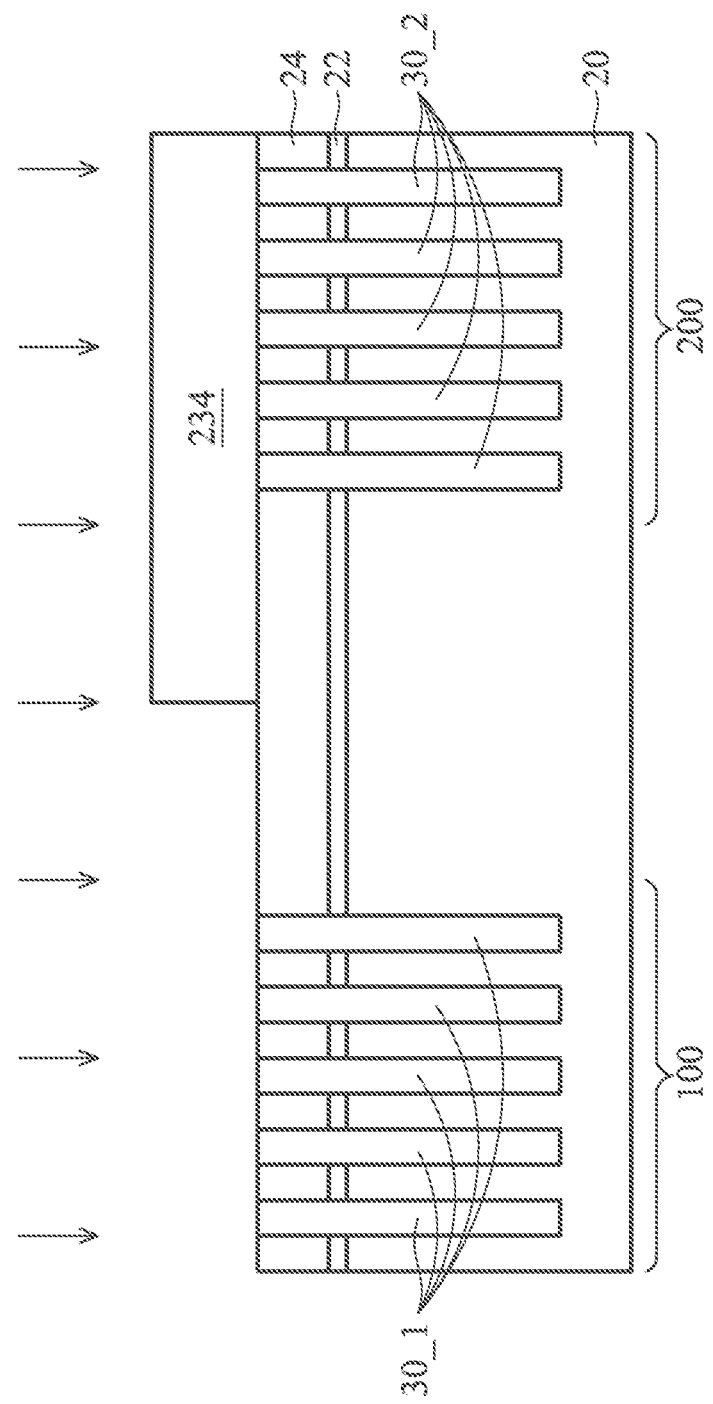
Figure 9:
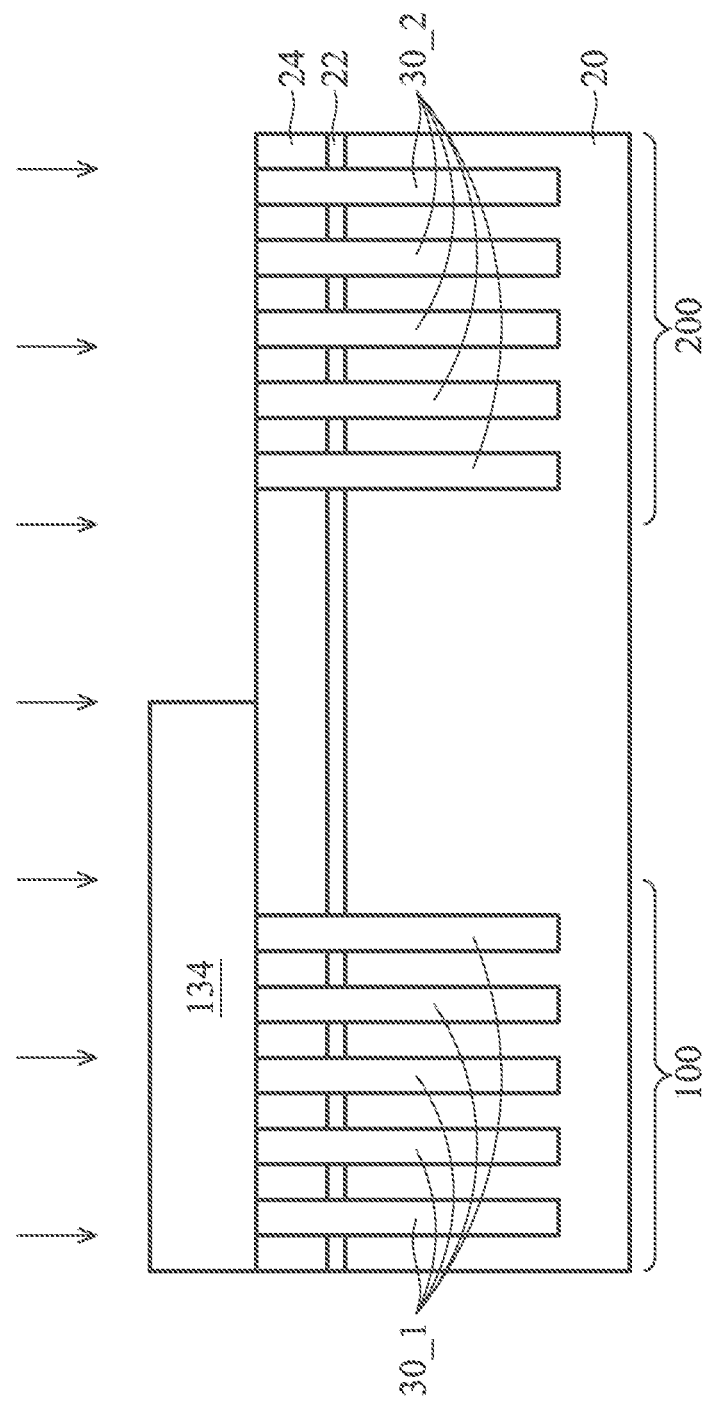
Figure 10:
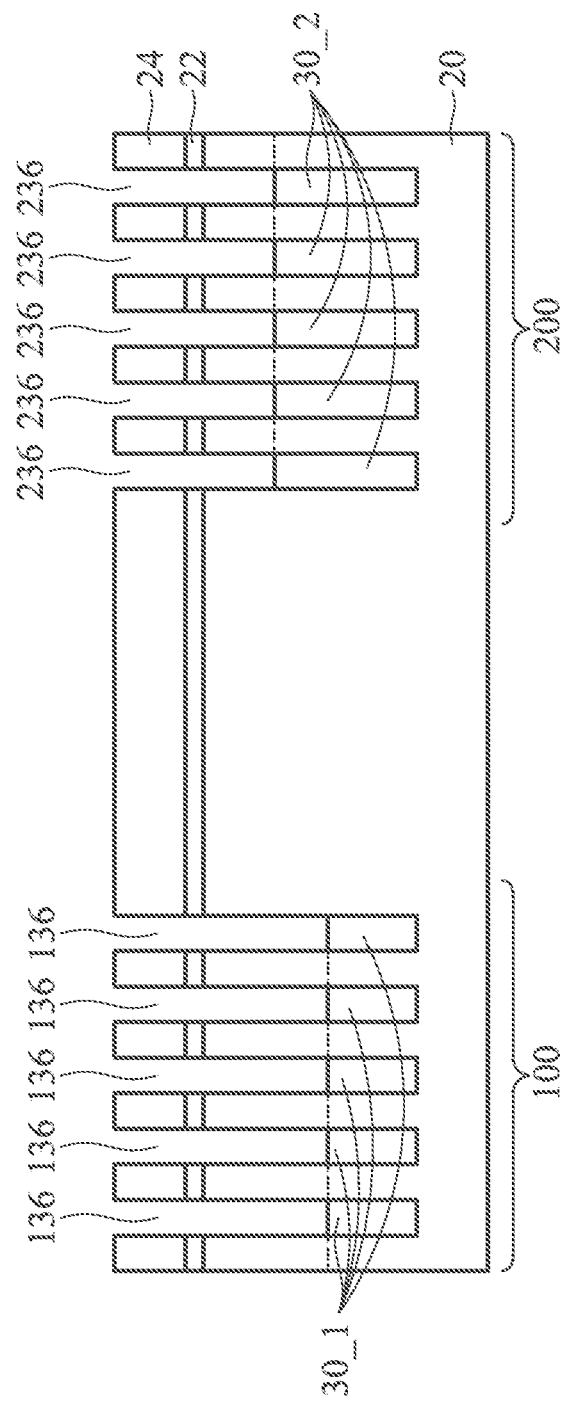

FIGS. 8 through 10 illustrate an alternative embodiment. The initial structure used in this embodiment is similar to what is shown in FIG. 1. Next, referring to FIG. 8, after the formation of photo resist 234 for device region 200, a first implantation is performed with a first dosage to introduce a first impurity into STI regions 30_1. The resulting STI regions 30_1 have a first impurity concentration. Next, as shown in FIG. 9, photo resist 234 is removed, and photo resist 134 is formed. A second implantation is performed with a second dosage to introduce a second impurity into STI regions 30_2. The resulting STI regions have a second impurity concentration. In an exemplary embodiment, the first impurity includes phosphorous, while the second impurity includes boron.

Next, as shown in FIG. 10, photo resist 134 is removed, and STI regions 30 are recessed, for example, using a wet etch or other methods. Due to the different impurity concentrations in STI regions 30_1 and 30_2, the etching rates of STI regions 30_1 and 30_2 are different, and hence the resulting fin heights $H_{fin1}$ and $H_{fin2}$ are different. The difference in fin heights $H_{fin1}$ and $H_{fin2}$ may be further increased by making the pattern density of STI regions 30_1 different from the pattern density of STI regions 30_2 in order to introduce a pattern-loading effect, so that the difference in etching rates of STI regions 30_1 and 30_2 is further increased. In alternative embodiments, no STI doping as shown in FIGS. 8 and 9 are performed. However, the pattern density of STI regions 30_1 is different from that of STI regions 30_2, and the pattern-loading effect is used to result in the fin height difference.

In subsequent steps, mask layer 24 and pad layer 22 are removed, resulting in the structure shown in FIG. 6. Processes are then continued to form FinFETs 160 and 260, as shown in FIG. 7.

Figure 18:
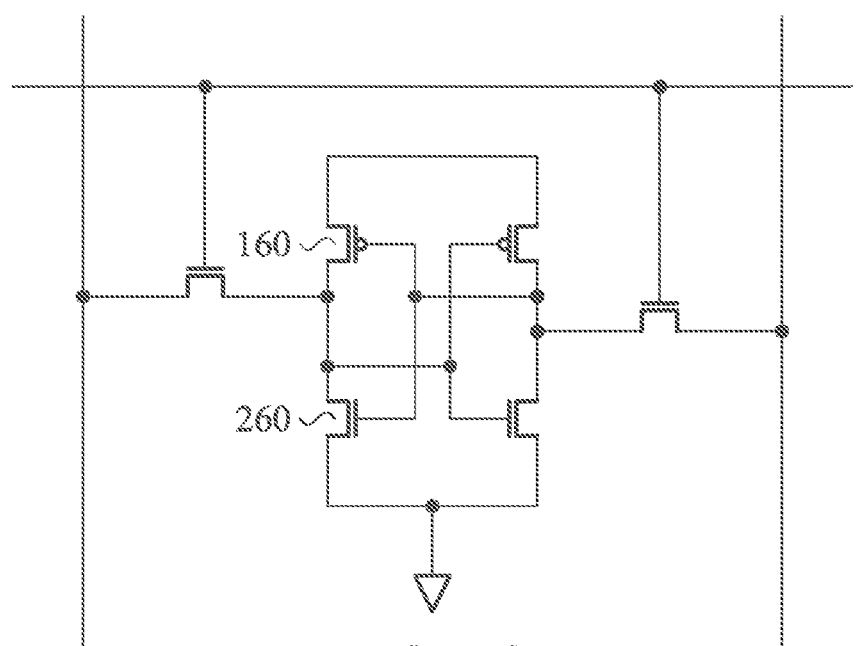
FIG. 18 illustrates a static random access memory including two FinFETs with fins having different fin heights.

By differentiating fin heights in different device regions, the junction window is increased, which means that the fin heights of FinFETs in different device regions are no longer tied together. With the FinFETs in different device regions having different fin heights, it is easier to tune the performance of devices in different device regions. Further, in the embodiment wherein FinFET 160 (FIG. 7) in device region 100 is a p-type FinFET and FinFET 260 in device region 200 is an n-type FinFET, the resulting fin height of p-type FinFET 160 is greater than the fin height of n-type FinFET 260. Accordingly, p-type FinFET 160 and n-type FinFET 260 may be used in a same SRAM cell (FIG. 18). For example, p-type FinFET 160 may be a pull-up transistor, and n-type FinFET 260 may be a pull-down transistor. The greater fin height $H_{fin1}$ of p-type FinFET 160 may compensate for the lower hole mobility compared to the higher electron mobility of n-type FinFET 260. The performance of p-type FinFET 160 and the performance of n-type FinFET 260 may thus be balanced.

Figure 11A:
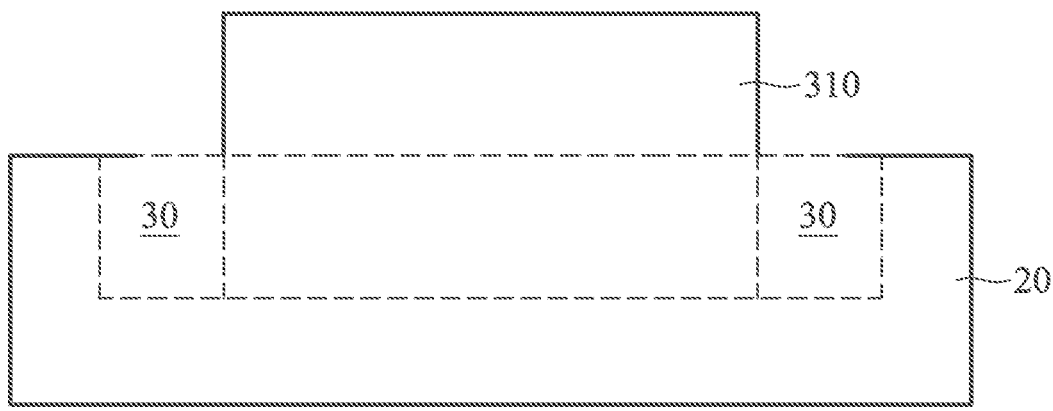
FIGS. 11A through 16B are cross-sectional views and perspective views of intermediate stages in the manufacturing of a FinFET in accordance with another embodiment.

FIGS. 11A through 16B illustrate intermediate stages in the manufacturing of a FinFET in accordance with yet another embodiment, wherein the difference in the recessing depths of STI regions 30 are applied to a single FinFET. First, referring to FIGS. 11A and 11B, semiconductor fin 310, which may be a silicon fin formed of the same material as the underlying semiconductor substrate 20, is formed. The formation of semiconductor fin 310 may be essentially the same as the formation of fins 138 or 238 in FIGS. 2 through 6. FIG. 11A illustrates a lengthwise cross-section view, wherein the dotted lines indicate that semiconductor fin 310 and semiconductor substrate 20 are connected through semiconductor strip 311 (FIG. 11B). FIG. 11B illustrates a widthwise cross-sectional view. The fin height of semiconductor fin 310 is $H_{fin}$, and the fin width of semiconductor fin 310 is $W_{fin}$.

Figure 12:
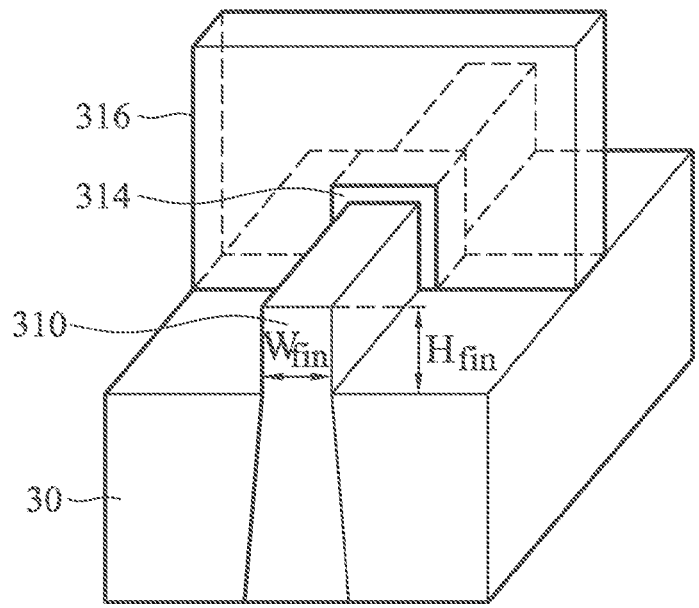
Figure 13:
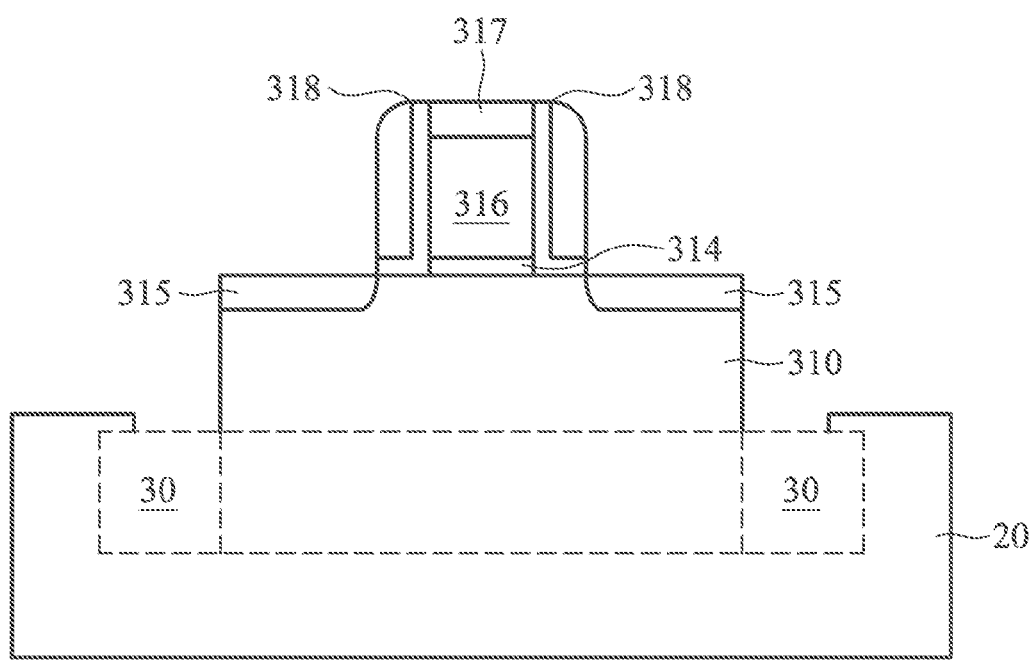

Next, as shown in FIG. 12, which is a perspective view, gate dielectric 314 and gate electrode 316 are formed. Gate dielectric 314 is formed on the top surface and sidewalls of semiconductor fin 310. Gate electrode 316 is formed on gate dielectric 314. Lightly doped source and drain (LDD) regions 315 may then be formed by implanting semiconductor fin 310. In an embodiment, slim spacers 318 as shown in FIG. 13 may be formed on the sidewalls of gate dielectric 314 and gate electrode 316, wherein LDD regions 315 may be formed before or after the formation of slim spacers 318. Optionally, mask layer 317, which may be formed of a nitride, is formed. FIG. 13 also illustrates mask layer 317.

Figure 11B:
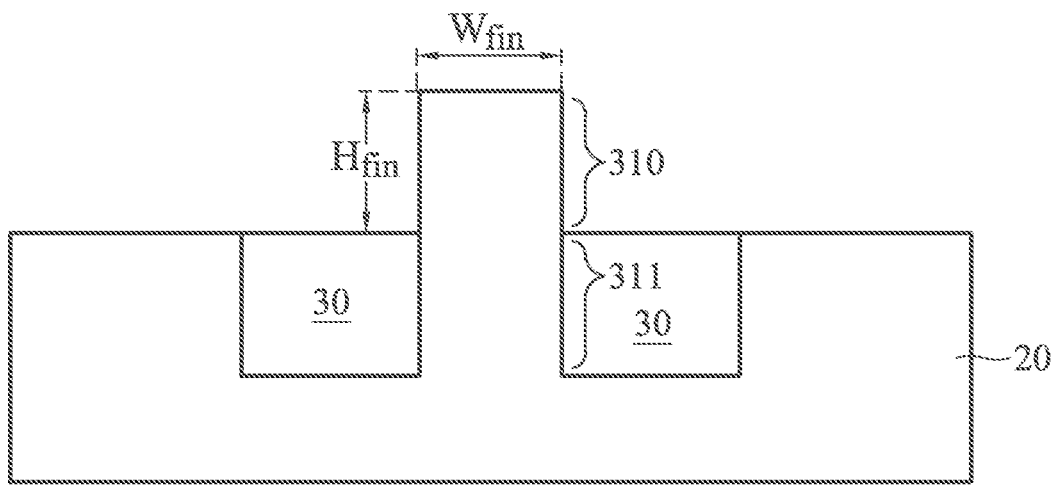
Figure 14A:
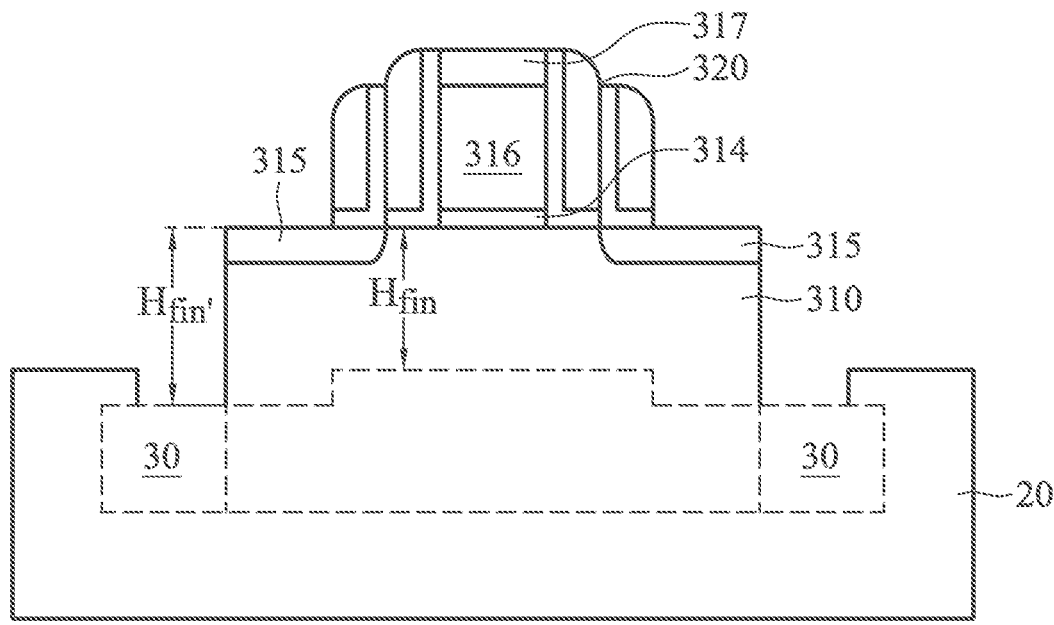
Figure 14B:
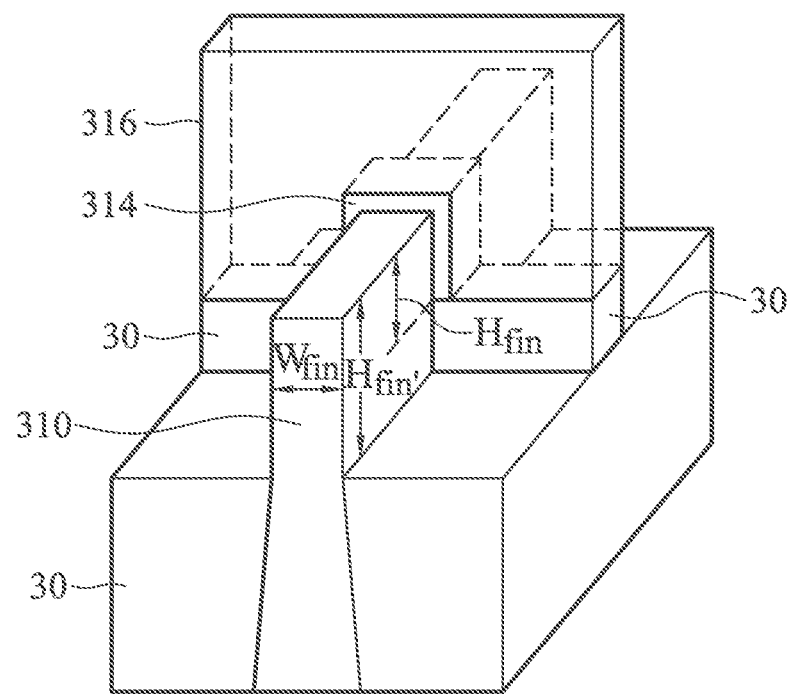

Next, as shown in FIG. 14A, gate spacers 320 are formed. Gate spacers 320 may include the previously formed slim spacers 318. It is realized that gate spacers 320 may have many different variations. For example, as shown in FIG. 14A, each gate spacer 320 may have a nitride-oxide-nitride-oxide (NONO structure). In alternative embodiments, each gate spacer 320 may only have a nitride layer on an oxide layer (referred to as an NO structure). The exposed portions of STI regions on opposite sidewalls of semiconductor fin 310 that is not covered by gate electrode 316 are recessed. A perspective view of the structure shown in FIG. 14A is shown in FIG. 14B. To clearly illustrate the heights of semiconductor fin 310, gate spacers 320 are not shown. In the resulting structure, semiconductor fin 310 has two heights. The portion of semiconductor fin 310 (which also includes the channel region of the resulting FinFET) covered by gate spacers 320 and gate electrode 316 has fin height $H_{fin}$, which fin height is the same as shown in FIG. 11B. As the result of the recessing of STI regions 30, the portions of semiconductor fin 310 that are not covered have an increased fin height $H_{fin'}$. In an embodiment, $H_{fin'}$ is greater than fin height $H_{fin}$ by greater than about 2 nm, or even greater than about 10 nm. Alternatively, a ratio $H_{fin'}/H_{fin}$ may be greater than about 1.05, and may even be greater than about 1.08, or between about 1.05 and about 1.5.

Figure 15A:
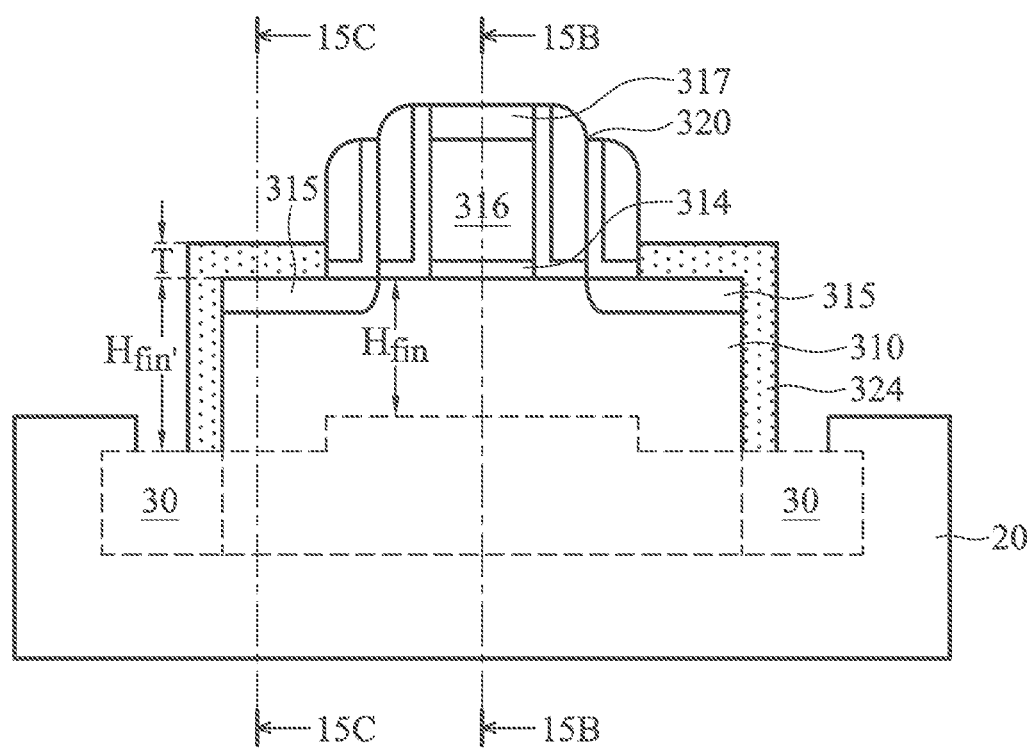

Next, as shown in FIG. 15A, epitaxial semiconductor layers 324 are epitaxially grown on the exposed portions of semiconductor fin 310. Epitaxial semiconductor layers 324 may comprise silicon, germanium, carbon, and/or other known semiconductor materials. In an embodiment wherein the resulting FinFET is of p-type, epitaxial semiconductor layers 324 may comprise silicon and possibly germanium in addition to silicon. In alternative embodiments wherein the resulting FinFET is of n-type, epitaxial semiconductor layers 324 may comprise silicon and possibly carbon in addition to silicon. Thickness T of epitaxial semiconductor layers 324 may be greater than about 10 nm.

Figure 15B:
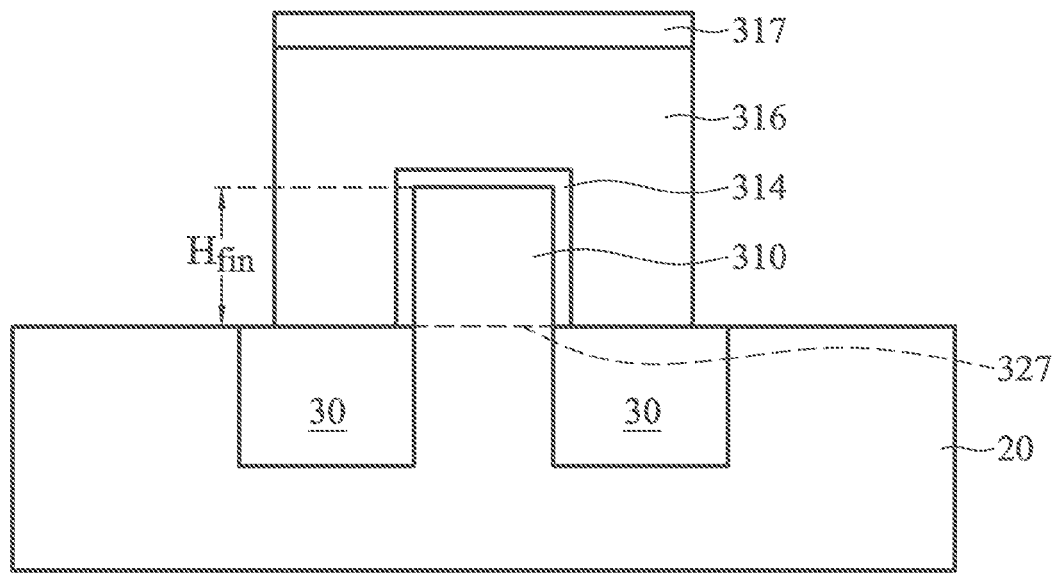
Figure 15C:
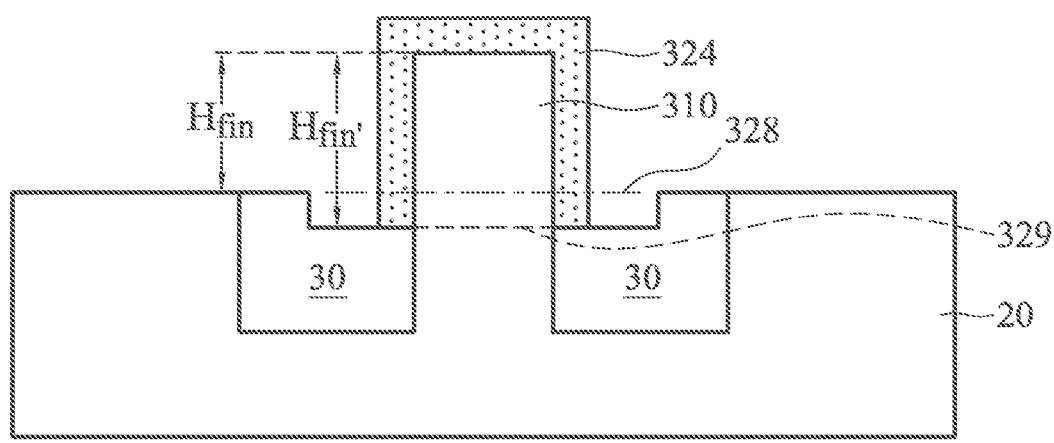

FIG. 15B illustrates an additional cross-sectional view of the structure shown in FIG. 15A, wherein the cross-sectional view is obtained from the vertical plane crossing line 15B-15B in FIG. 15A. Fin height $H_{fin}$ is marked in FIG. 15B. FIG. 15C illustrates an additional cross-sectional view of the structure shown in FIG. 15A, wherein the cross-sectional view is obtained from the vertical plane crossing line 15C-15C in FIG. 15A. Fin height $H_{fin'}$ is marked in FIG. 15C. Comparing FIGS. 15B and 15C, it is observed that due to the increased fin height $H_{fin'}$, the volume of epitaxial semiconductor layers 324 is increased. If the fin height of semiconductor fin 310 is not increased from value $H_{fin}$ to value $H_{fin'}$, epitaxial semiconductor layers 324 would have been limited in the region over dotted line 328. In FIGS. 15B and 15C, although there is no clear visible bottoms, semiconductor fins 310 are considered to have bottoms level with top surfaces of STI regions 30 on opposite sides of respective semiconductor fin portions 310. Accordingly, as shown in FIG. 15B, the bottom of the portion of semiconductor fin 310 directly under electrode 316 illustrated as line 327, and in FIG. 15C, the bottom of the portion of semiconductor fin 310 not covered by gate electrode 316 and gate spacers 320 is illustrated as line 329. Bottom 329 is lower than bottom 327.

Figure 16A:
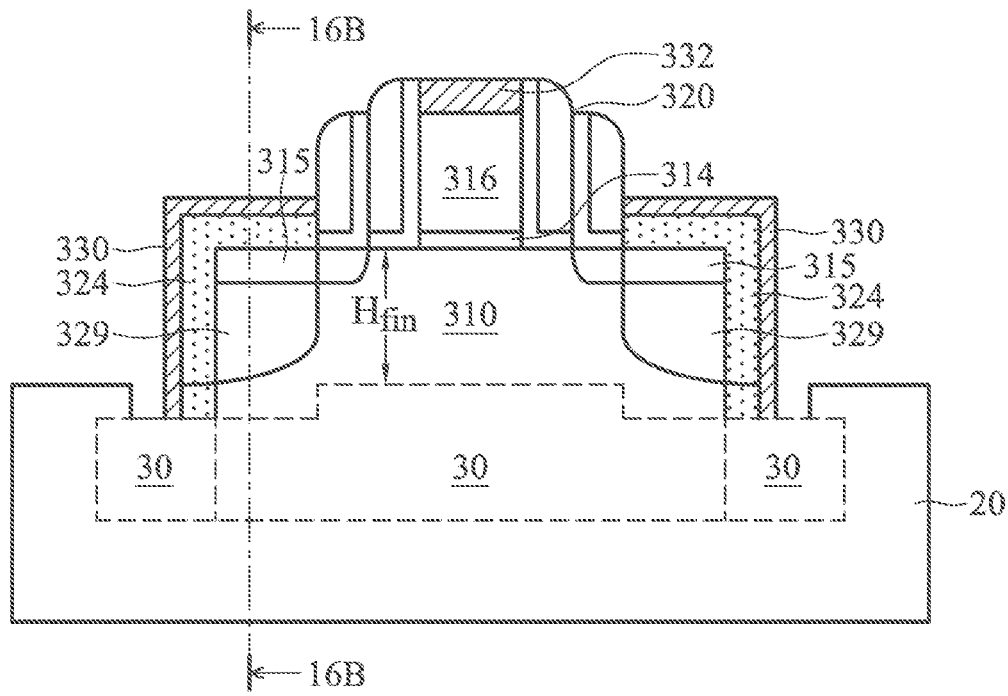

Referring to FIG. 16A, implantations are performed to form source and drain regions 329 in semiconductor fin 310 and epitaxial semiconductor layers 324. Mask layer 317 is also removed, and source/drain silicide regions 330 and gate silicide region 332 are formed on epitaxial semiconductor layers 324. The formation of the source and drain regions 329 and silicide regions 330 may adopt known methods. After the formation of silicide regions 330 and 332, epitaxial semiconductor layers 324 may be fully, or partially, consumed. In the resulting structure, silicide regions 330 may be separated from semiconductor fin 310 by remaining portions of epitaxial semiconductor layers 324, or contact semiconductor fin 310 directly.

Figure 16B:
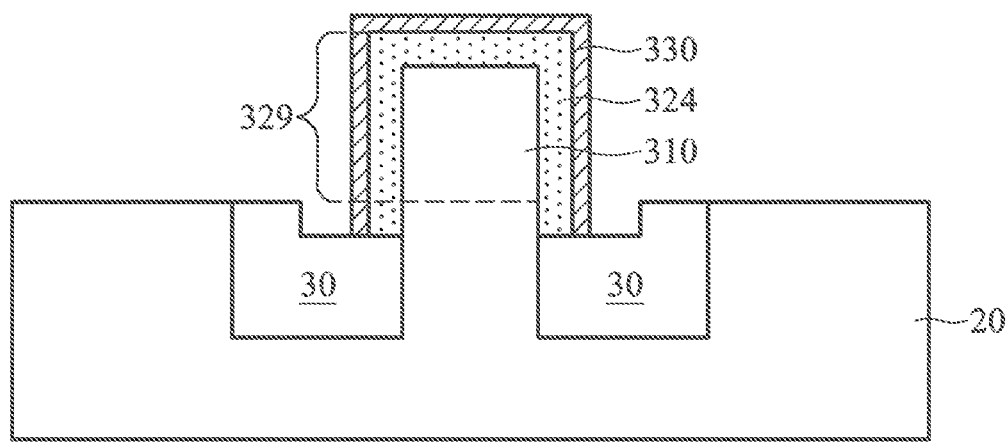

FIG. 16B illustrates an additional cross-sectional view of the structure shown in FIG. 16A, wherein the cross-sectional view is obtained from the vertical plane crossing line 16B-16B in FIG. 16A. It is observed that by recessing STI regions 30 before the epitaxial formation of epitaxial semiconductor layers 324, the volume of the source and drain regions 329 is increased. This has the positive effect of reducing the current crowding in the source and drain regions 329. The desirable tensile or compressive stress applied to the channel region of the resulting FinFET is also increased due to the increased volume of stressed source and drain regions 329. In addition, since the size of silicide regions 330 is also increased due to the increased sidewall areas of epitaxial semiconductor layers 324, the current crowding effect in silicide regions 330 is also reduced.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a first shallow trench isolation (STI) region and a second STI region in a semiconductor substrate, wherein a portion of the semiconductor substrate between and adjoining the first STI region and the second STI region forms a semiconductor strip;
   recessing top surfaces of the first STI region and the second STI region, wherein a top portion of the semiconductor strip forms a semiconductor fin comprising a first fin portion and a second fin portion;
   forming a gate dielectric on a top surface and sidewalls of the first fin portion, wherein the gate dielectric is not on the second fin portion;
   forming a gate electrode on the gate dielectric, wherein the gate electrode covers the first fin portion and a first portion of the first STI region, and wherein a second portion of the first STI region is not covered by the gate electrode; and
   after the step of forming the gate electrode, recessing the second portion of the first STI region.

2. The method of claim 1 further comprising epitaxially growing an epitaxial layer on the second fin portion, wherein the epitaxial layer comprises a portion directly over the second portion of the first STI region.

3. The method of claim 2 further comprising siliciding the epitaxial layer.

4. The method of claim 2 further comprising implanting the epitaxial layer and the second fin portion to form a source/drain region.

5. The method of claim 2, wherein the step of epitaxially growing the epitaxial layer is performed after the step of recessing the second portion of the first STI region.

6. The method of claim 1 further comprising, before the step of recessing, forming a gate spacer on a sidewall of the gate electrode.

7. The method of claim 1, wherein after the step of recessing, the second portion of the first STI region is recessed by greater than about 5 nm.

8. A method comprising:
providing a structure comprising:
a semiconductor substrate;
a semiconductor strip over the semiconductor substrate;
a semiconductor fin directly over the semiconductor strip and comprising a first fin portion and a second fin portion; and
an insulation region adjoining the semiconductor strip and lower than the semiconductor fin; and
forming a FinFET comprising:
forming a gate dielectric on a top surface and sidewalls of the first fin portion, wherein the gate dielectric is not on the second fin portion;
forming a gate electrode on the gate dielectric, wherein the gate electrode covers the first fin portion and a first insulation portion of the insulation region; and
recessing a second insulation portion of the insulation region not covered by the gate electrode, wherein the first insulation portion of the insulation region is not recessed.

9. The method of claim 8 further comprising, before the step of recessing, forming a gate spacer on a sidewall of the gate electrode.

10. The method of claim 8 further comprising, after the step of recessing, epitaxially growing an epitaxial layer on the second portion of the semiconductor fin.

11. The method of claim 10 further comprising siliciding the epitaxial layer.

12. The method of claim 10 further comprising implanting the epitaxial layer and the second fin portion to form a source/drain region.

13. The method of claim 8, wherein after the step of recessing, the second insulation portion is recessed by greater than about 10 nm.

14. The method of claim 10, wherein the epitaxial layer comprises a portion directly over the second insulation portion.

15. A method comprising:
forming a first and a second plurality of shallow trench isolation (STI) regions in a semiconductor substrate, wherein first portions of the semiconductor substrate between the first plurality of STI regions form first semiconductor strips, and second portions of the semiconductor between the second plurality of STI regions form second semiconductor strips;
etching the first plurality of STI regions to a first depth, wherein portions of the first semiconductor strips over top surfaces of the first plurality of STI regions form first semiconductor fins; and
etching the second plurality of STI regions to a second depth different from the first depth, wherein portions of the second semiconductor strips over top surfaces of the second plurality of STI regions form second semiconductor fins.

16. The method of claim 15 further comprising:
performing a first implantation on the first plurality of STI regions to a first impurity concentration using a first impurity;
performing a second implantation to the second plurality of STI regions to a second impurity concentration using a second impurity; and
performing the step of etching the first plurality of STI regions and the step of etching the second plurality of STI regions simultaneously.

17. The method of claim 16, wherein the first impurity concentration is different from the second impurity concentration.

18. The method of claim 16, wherein the first impurity is different from the second impurity.

19. The method of claim 18, wherein the first impurity is a p-type impurity, and the second impurity is an n-type impurity.

20. The method of claim 15, wherein the step of etching the first plurality of STI regions and the step of etching the second plurality of STI regions are performed in different etching steps.

* * * * *

UNITED STATES PATENT AND TRADEMARK OFFICE
CERTIFICATE OF CORRECTION

PATENT NO. : 8,673,709 B2  
APPLICATION NO. : 13/764549  
DATED : March 18, 2014  
INVENTOR(S) : Tsung-Lin Lee et al.

Page 1 of 1

It is certified that error appears in the above-identified patent and that said Letters Patent is hereby corrected as shown below:

In the Claims:

In Col. 8, line 8, claim 15, delete "ofSTI" and insert --of STI--.
In Col. 8, line 14, claim 15, delete "ofSTI" and insert --of STI--.
In Col. 8, line 22, claim 16, delete "ofSTI" and insert --of STI--.
In Col. 8, line 40, claim 20, delete "ofSTI" and insert --of STI--.

Signed and Sealed this
Twenty-seventh Day of May, 2014

Michelle K. Lee
*Deputy Director of the United States Patent and Trademark Office*